United States Patent [19]
Kohn

[11] Patent Number: 5,393,990
[45] Date of Patent: Feb. 28, 1995

[54] HEMT STRUCTURE

[75] Inventor: Erhard Kohn, Titusville, N.J.

[73] Assignee: Siemens Corporate Research, Inc., Princeton, N.J.

[21] Appl. No.: 980,870

[22] Filed: Nov. 24, 1992

Related U.S. Application Data

[63] Continuation of Ser. No. 333,207, Apr. 4, 1989, abandoned.

[51] Int. Cl.[6] .......................................... H01L 31/072
[52] U.S. Cl. ................................... 257/12; 257/191; 257/194
[58] Field of Search ............... 357/22 A, 22 B, 22 G, 357/4, 16, 55; 257/12, 191, 194

[56] References Cited

U.S. PATENT DOCUMENTS

| | | | |
|---|---|---|---|
| 4,593,301 | 6/1986 | Inata et al. | 357/22 |
| 4,600,932 | 7/1986 | Norris | 357/22 |
| 4,833,508 | 5/1989 | Ishikawa et al. | 357/22 A |

FOREIGN PATENT DOCUMENTS

| | | |
|---|---|---|
| 0308969 | 3/1989 | European Pat. Off. |
| 2620268 | of 0000 | France |

OTHER PUBLICATIONS

Siei, High electron mobility transistor structure, Siemens AG Sep. 25, 1987–US–101107, No.–SR Pub R(DE ES FRGGIT), Derwent Publications Ltd.
Patent Abstracts of Japan, vol. 12, No. 150 (E–606)(2997), 10 May 1988 & JP A–62264672 (Fujitsu) Nov. 17, 1987.
Patent Abstracts of Japan, vol. 8, No. 115 (E–247)(1552), 29 May 1984; & JP A–5928383 (Nippon Denki) 15 Feb. 1984.
Journal of Applied Physics, vol. 63, No. 5, 1 Mar. 1988, pp. 1541–1548, Woodbury, N.Y., US; J. R. Kirtley et al.: "Noise spectroscopy of deep level (DX) centers in GaAs–AlxGa1–xAs heterostructures."
European Search Report corresponding to European Application No. EP 90 10 6417.

*Primary Examiner*—Rolf Hille
*Assistant Examiner*—Roy Potter
*Attorney, Agent, or Firm*—Adel A. Ahmed

[57] ABSTRACT

A high electron mobility transistor includes a donor layer of aluminum gallium arsenide (AlGaAs) for forming a two-dimensional electron gas (2DEG) in a proximate buffer layer of gallium arsenide. The donor layer has a composition profile including a relatively high concentration of aluminum over a first thickness portion proximate the buffer layer, a low and constant concentration of aluminum over a second thickness portion distal from the buffer layer and a graded concentration of aluminum in a third thickness portion of the donor layer between the first and second thickness portions, transitioning between the high and the low concentrations of aluminum. The donor layer has a doping profile including a high level doping spike in the first thickness portion and a low doping level over the second and third thickness portions.

10 Claims, 2 Drawing Sheets

HEMT STRUCTURE

CROSS-REFERENCE TO RELATED APPLICATION

This is a continuation of Ser. No. 07/333,207, filed Apr. 4, 1989, now abandoned.

The present invention relates to field effect transistors (FET's) and more particularly to high electron mobility transistors (HEMT's) utilizing gallium arsenide technology. Such a transistor is a heterostructure of two materials: gallium arsenide (GaAs) and aluminum gallium arsenide (AlGaAs). The heterojunction between them separates electrons from their donor ions and confines conduction path electrons to a potential well in an undoped gallium arsenide layer known as the buffer layer, where they exhibit high mobility.

The conduction path electrons form what is known as a two-dimensional electron gas (2DEG), typically about 100 Å thick. Electrons forming the 2DEG are supplied from donor ions in a donor layer of AlGaAs formed over the buffer layer, but also sometimes separated from the buffer layer by a thin, undoped AlGaAs layer typically 15–25 Å thick, known as the spacer layer. Typically, in conventional devices, the AlGaAs layer is of a constant composition. It is herein recognized and understood that a 2DEG is also typically formed in indium gallium arsenide, sand latched inbetween the barrier layer and the buffer layer.

A layer of n-doped GaAs, sometimes referred to as a cap layer, is generally formed over the AlGaAs donor layer and a recess in this n-doped GaAs layer has a gate electrode formed therein for controlling conduction by the 2DEG between source and drain electrodes which typically reach through the n-doped GaAs layer into the donor layer and thereby approach the location of the 2DEG so as to provide low-resistance paths thereto.

As a result of the band structure in GaAs, electrons provided by donors are not always freely available for conduction. Depending on the aluminum content, donors can appear at a deep energy level in the band-gap and the capture and emission of electrons from such donors, or "DX-centers", is a complex phenomenon which involves relatively slow time-constants and which leads to instabilities in device electrical characteristics. Such instabilities manifest themselves primarily as a change in transconductance with time. Thus, for example, a step change in a gate-source voltage of a transistor exhibiting such effects causes an initial resulting change in drain current which, however, is not sustained with the passage of time, so that the final, resulting change in drain current is smaller than the initial change. Another form of instability relates to temperature behavior, so that the threshold voltage of such a transistor drops drastically when the transistor is cooled below a given temperature, typically 150 degrees Kelvin.

When energy level is plotted against aluminum content in AlGaAs, it is found that the lower edge of the conduction band rises as the aluminum content is increased from zero, peaking at a mole fraction of about 0.4. Thereafter, the lower edge of the conduction band drops from this peak with increasing aluminum content.

In forming the 2DEG, it is desirable to have a large difference between the conduction band level edges of the GaAs and AlGaAs forming the heterojunction, since it is this difference that constitutes the potential well containing the 2DEG. It has been recognized that the avoidance of problems posed by DX-center instabilities are avoidable by ensuring that DX-center levels are within, or close to, the conduction band. This is because donor electrons in that situation will tend to fall to the lower edge of the conduction band and the effects of electron capture and emission are then no longer appreciably relevant to conduction and therefore are not important causes of instability.

However, it is found that the DX-centers are within the conduction band for AlGaAs only when the aluminum mole fraction is less than about 0.2 or greater than 0.7 or so. Accordingly, it has generally been the practice to utilize mole fractions of 0.2 or less in making stable devices. However, this limits the available difference between the conduction band levels across the heterojunction, so that the available potential well capacity for forming the 2DEG is limited. The mutual conductance and current-carrying capacity of a device are limited in this manner and high frequency performance is thereby limited.

Alternative structures have been proposed for avoiding DX-center related problems including a "Superlattice Gate Structure" and a "SISFET". Nevertheless, the present invention is primarily directed to an improved depletion-mode structure of the type having a high aspect ratio and a recessed gate configuration.

In accordance with an aspect of the invention, a high electron mobility transistor including source, drain, and control electrodes, comprises a buffer layer of gallium arsenide and a donor layer of aluminum gallium arsenide (AlGaAs) associated with the buffer layer of gallium arsenide for forming a two-dimensional electron gas (2DEG) therein. The donor layer has a composition profile exhibiting a relatively high concentration of aluminum over a first thickness portion proximate the buffer layer, exhibiting a relatively low and generally constant concentration of aluminum over a second thickness portion distal from the buffer layer and exhibiting a graded concentration of aluminum in a third thickness portion of the donor layer intermediate the first and second thickness portions for transitioning gradually between the relatively high and low concentrations of aluminum. The donor layer has a doping profile exhibiting a relatively high level doping spike associated with the first thickness portion and a relatively low doping level over the second and third thickness portions.

In accordance with another aspect of the invention, a high electron mobility transistor is generally of the type wherein a donor layer of aluminum gallium arsenide (AlGaAs) supplies electrons for forming a two-dimensional electron gas (2DEG) in a proximate buffer layer of gallium arsenide. A composition profile and doping profile in the AlGaAs donor layer comprises a relatively high concentration of aluminum over a first portion of the thickness of the AlGaAs buffer layer proximate the buffer layer; a relatively low and relatively constant concentration of aluminum over a second portion of the thickness dimension of the AlGaAs donor layer, distal from the buffer layer; a relatively high doping spike substantially contained within the first portion of thickness of the AlGaAs buffer layer; a relatively low level of doping over the second portion of the thickness dimension of the AlGaAs buffer layer; and a graded concentration of aluminum in a third portion of the thickness dimension of the AlGaAs donor layer between the first and second portions transitioning between the relatively high and the relatively low concentrations of aluminum.

A high electron mobility transistor in accordance with yet another aspect of the invention includes a first layer of substantially undoped gallium arsenide, a doped second layer of aluminum gallium arsenide, representable as $Al_xGa_{1-x}As$, formed over the first layer at a first interface for forming a two-dimensional electron gas therein, and a gate electrode formed over the second layer at a second interface. The doped second layer comprises at the first interface, an aluminum content of less than a first value whereat DX-centers occur below a conduction-band edge of the first layer. The aluminum content remains substantially at the first value across a first portion of a thickness dimension of the second layer, thence increasing to a second value over a second portion of the thickness dimension, the second portion being relatively thin compared with the first portion. The aluminum content remains thence substantially at the second value over a third portion of the thickness dimension, the third portion being relatively thin compared with the first portion, and thence drops step-wise to a negligibly small value and remains at the negligibly small value until the second interface. A relatively high doping concentration spike is substantially contained within the second portion of the thickness dimension. The doping concentration over the first and second portions of the thickness dimension is relatively low and relatively constant.

Figure 1:
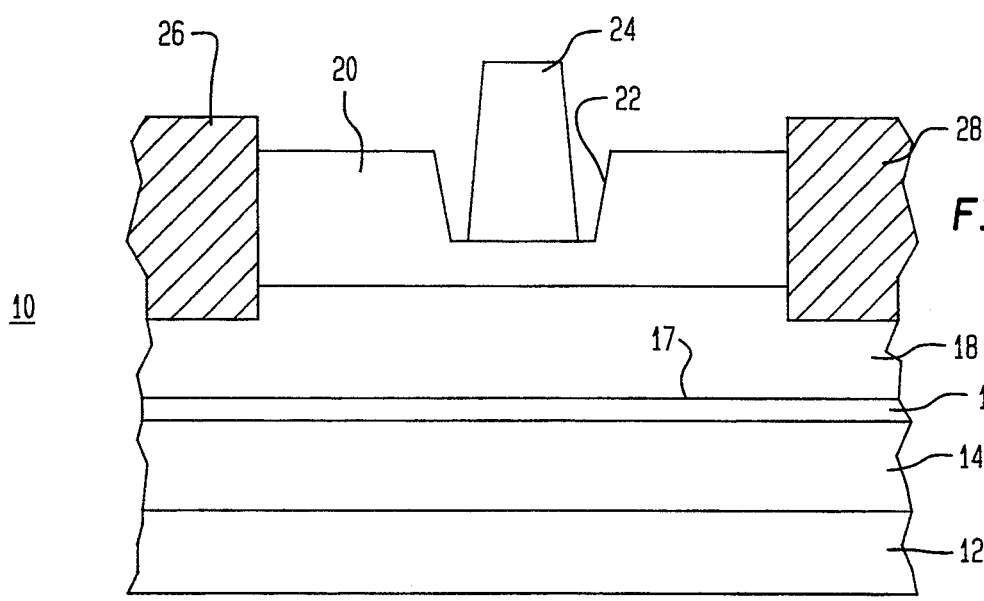
FIG. 1 shows in diagrammatic form a cross-sectional view, not to scale, of a device in accordance with the invention.

In the HEMT structure shown in FIG. 1, generally indicated as 10, semi-insulating gallium arsenide (GaAs) substrate 12 has formed over it an undoped GaAs buffer layer 14. Optically, a relatively thin spacer layer 16 is formed over buffer layer 14 and over this in turn is a donor layer 18 of aluminum gallium arsenide (AlGaAs), relatively heavily doped, typically with an n-type dopant (n+). A layer 20 of n+ doped GaAs is formed over the n+ AlGaAs layer and has a recess 22 formed in it, in which a metallic gate electrode 24 is formed so as to form a Schottky barrier junction with layer 20. A source electrode 26 and a drain electrode 28 are formed to reach through layer 22 into layer 18 so as to provide low resistance connections to a main conduction path.

Figure 2:
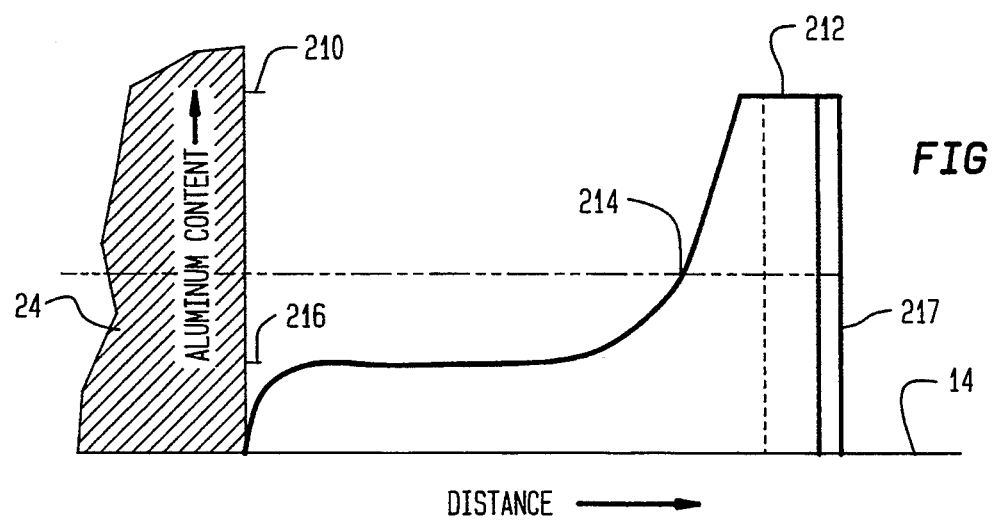
FIG. 2 shows a diagram helpful to an understanding the composition of a device in accordance with the invention.

Layer 18 is made with a varying aluminum content, in the form $Al_xG_{1-x}As$, where x is a variable. The aluminum content is shown in FIG. 2, in which the vertical dimension of layer 18 is more conveniently represented by the horizontal axis of FIG. 2. The vertical axis represents aluminum content. At the right-hand side of FIG. 2, a portion of GaAs buffer layer 14 is shown in which the aluminum content is essentially zero. Proceeding to the left, the aluminum content rises abruptly to a level 210 which is above the level below which DX-centers occur in the bandgap region. This level of aluminum content is maintained substantially constant over a region 212, typically 100 Å wide or so. Thereafter, proceeding to the left in FIG. 2, the aluminum content drops rapidly with distance, in accordance with a higher order curve 214, for example, a parabola. At a level 216, corresponding to the level referred to in the introductory portion of the. specification below which the DX-centers are within the conduction band, that is, when the aluminum mole fraction is 0.2 or so, the aluminum content thereafter remains relatively constant, until the region of layer 20 and gate electrode 24 is reached.

Figure 3:
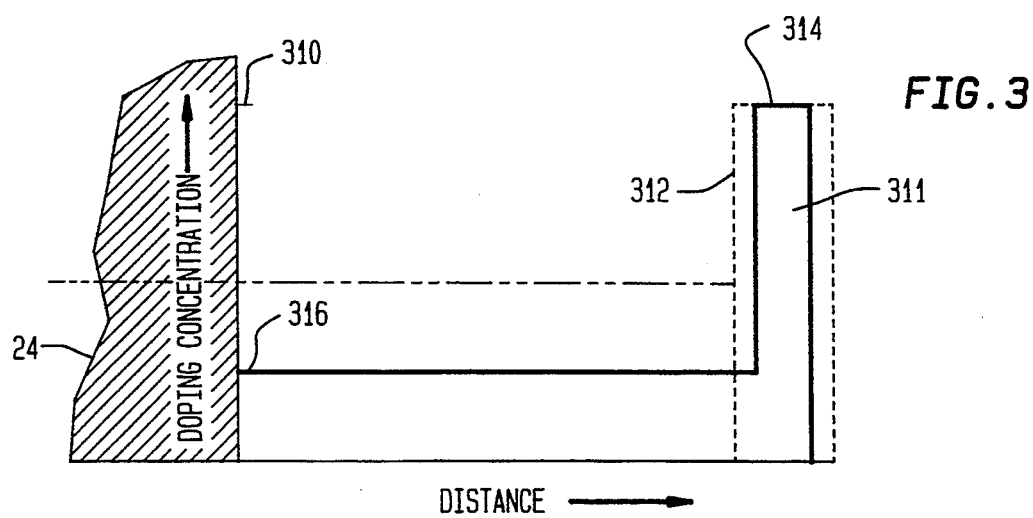
FIG. 3 shows a diagram helpful to an understanding the doping profile of a device in accordance with the invention.

FIG. 3 shows the doping profile in layer 18. Beginning at the right-hand side of FIG. 3, the region corresponding to spacer layer 16 is left substantially undoped. A high level of doping 310, in a so-called doping 'spike' 311 is formed in a relatively narrow region 314, slightly narrower and included within region 312, corresponding to region 212. Thereby, abrupt changes in doping are made not to coincide with abrupt changes in aluminum content composition. To the left of doping spike 311, the doping level is maintained relatively constant at a level 316 which is preferably between from one-third to one-fifth ($\frac{1}{3}-1/5$) the doping level 310 of spike 312.

Typically, the distance between spike 311 and gate electrode 24 is in the order of 200 Å. Doping spike 311 is in the order of 60 Å wide. Region 212 of high aluminum content typically extends 3 to 4 monolayers beyond doping spike 311 on the right-hand side and on the left-hand side. The peak level 310 of doping in spike 311 is in the order of $5 \times 10^{18}$ to $8 \times 10^{18}$ cm$^{-3}$.

In operation, electrons tunnelling from layer 18 form a two-dimensional electron gas (2DEG) in the potential well at heterojunction 17 between layer 16 and layer 14, resulting from the disparity in their conduction band levels. Since the aluminum concentration is high in region 212, DX-centers appear there within the bandgap level. However, because of the proximity to the 2DEG potential well, electrons resulting from such DX-centers in this region will gravitate into the potential well leaving the DX-centers ionized and therefore not able to pose problems of instability. An abrupt drop of aluminum content on the gate side of region 212, i.e. the left side in FIG. 2, would give rise to the possibility of a bandgap discontinuity on that side and would lead to the presence of another 2DEG where it is not desired. In accordance with the present invention, this drop is made gradual, as has been explained, so that no appreciable bandgap discontinuity occurs.

Figure 4:
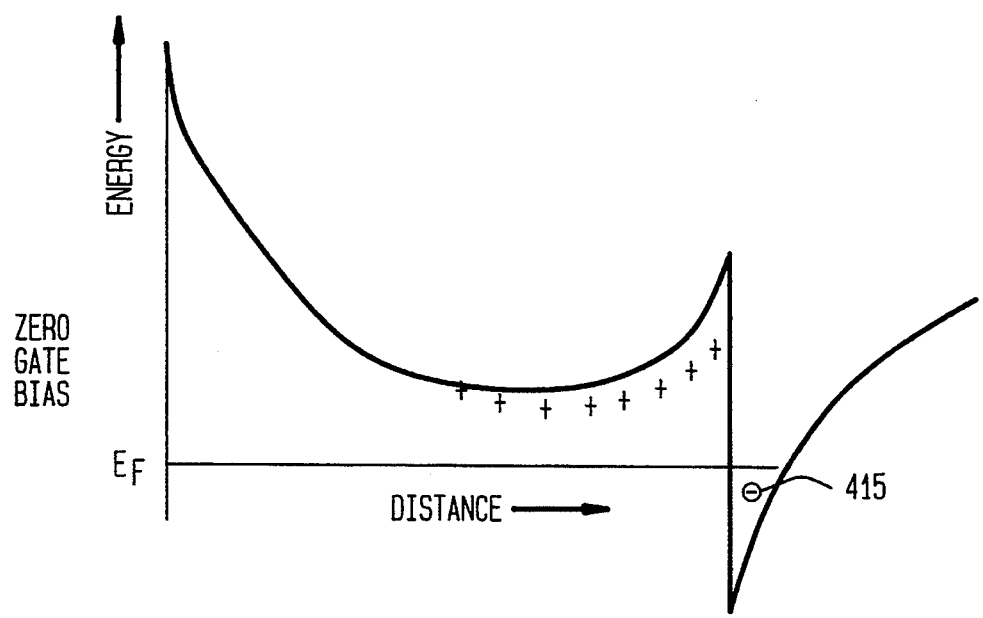
FIGS. 4 and 5 show diagrams helpful to an understanding of the operation of a device in accordance with the invention.

The doping level to the left of doping spike 311 in FIG. 3 is maintained at a fractional level 316 of the peak level 310 in part to reduce any tendency to drift into this region of electrons which are otherwise available for contribution to the 2DEG to the right of spike 311. Nevertheless, level 314 is maintained at a low enough value, so that DX-centers occur above the lower edge of the conduction band and thereby pose no problem. In accordance with the present invention, this benefit is obtained without the concomitant disadvantages described in reference to the low aluminum content as discussed in the introduction portion of the specification. FIG. 4 shows an energy band diagram for a device in accordance with the present invention, the abscissa representing layer 14 with a portion of layer 18 to the right. In FIG. 4, conditions for zero gate bias are shown, the 2DEG being indicated by reference numeral 415. DX-centers shown as crosses in FIGS. 4 and 5, in the region immediately to the left of the discontinuity are ionized and generate the 2DEG and are in a region of positive slope. The potential minimum is on the left side, towards the gate.

Figure 5:
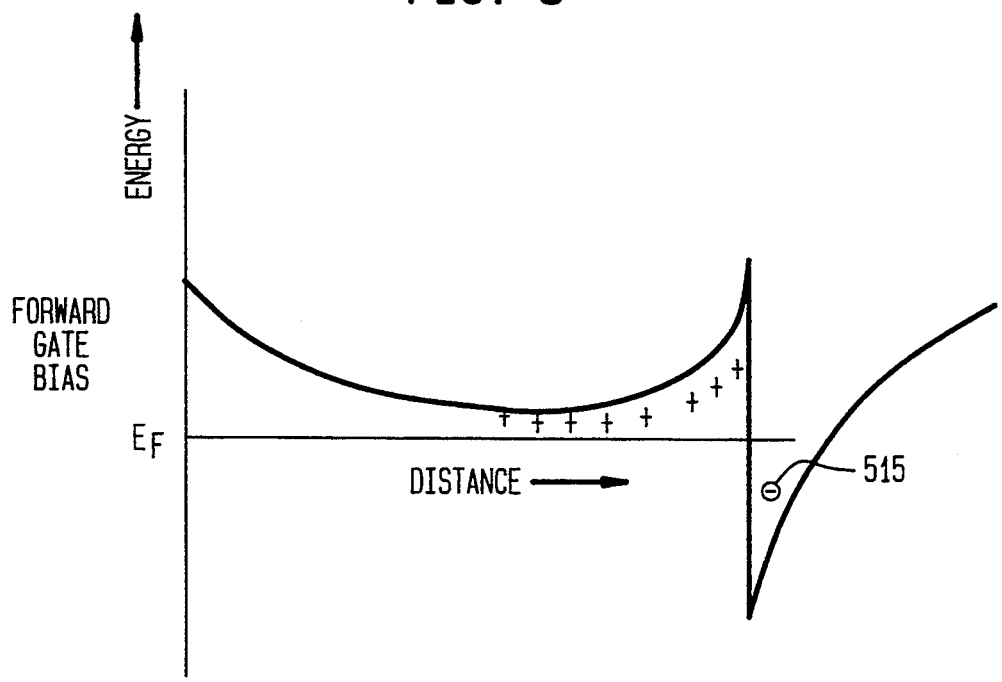

FIG. 5 shows conditions with positive gate bias. Since the aluminum concentration is sufficiently low (less than 0.2) over the center region, DX-centers do not occur below the conduction band edge.

While the invention has been described by way of an exemplary embodiment, the invention is not limited thereto. Various modifications in the composition profile, doping concentration, layer thicknesses and the like will be apparent to one of skill in the art. Such changes are contemplated to be within the scope of the invention as defined by the claims following.

I claim:

1. A high electron mobility transistor, including a first layer of substantially undoped gallium arsenide, a doped second layer of aluminum gallium arsenide, representable as $Al_xGa_{1-x}As$, formed over said first layer at a first interface for forming a two-dimensional electron gas therein, and a gate electrode formed over said second layer at a second interface, wherein said doped second layer comprises:

at said second interface, an aluminum content of less than a first value, such that DX-centers occur below a conduction-band edge of said first layer;

said aluminum content remaining substantially at said first value across a first portion of a thickness dimension of said second layer, thence increasing monotonically in a generally parabolic manner to a second value over a second portion of said thickness dimension, said second portion being relatively thin compared with said first portion, thence remaining substantially at said second value over a third portion of said thickness dimension, said third portion being relatively thin compared with said first portion, and thence dropping step-wise to a negligibly small value at said first interface;

a high doping concentration spike when compared to the doping in said first and second portions, is substantially contained within said third portion of said thickness dimension; and a constant doping concentration over said first and second portion of said thickness dimension.

2. A high electron mobility transistor as recited in claim 1 wherein said aluminum content of said first portion is sufficiently low for DX-centers to occur above a lower edge of a conduction band of material of said first portion.

3. A high electron mobility transistor as recited in claim 2, wherein said first portion is of the order of 200 A thick and said third portion is of the order of less than 100 A thick.

4. A high electron mobility transistor generally of the type wherein a donor layer of aluminum gallium arsenide (AlGaAs) supplies electrons for forming a two-dimensional electron gas (2DEG) in a proximate buffer layer of gallium arsenide, in said AlGaAs donor layer having a composition profile and doping profile, comprising:

a concentration of aluminum over a first portion of a thickness dimension of said AlGaAs donor layer proximate said buffer layer;

a low and constant concentration of aluminum over a second portion of said thickness dimension of said AlGaAs donor layer, as compared with said first portion, said second portion being distal from said buffer layer;

a graded concentration of aluminum in a third portion of said thickness dimension of said AlGaAs donor layer between said first and second portions transitioning between the differing concentrations of aluminum between said first and second portions;

wherein said graded concentration of aluminum starts at the level of said first portion, and proceeding in a direction towards said second portion, drops at a rate that diminishes along said direction towards said second portion, until said graded concentration reaches said low level at said second portion;

a doping spike substantially contained within said first portion of said thickness dimension of said AlGaAs donor layer; and a low level of doping over said second and third portions of said thickness dimension of said AlGaAs donor layer as compared against said first portion.

5. A high electron mobility transistor as recited in claim 4, wherein said first portion of said thickness dimension is thinner than said second portion.

6. A high electron mobility transistor as recited in claim 5, wherein the doping concentration at said doping spike is in the order of from three times to five times said relatively low level of doping.

7. A high electron mobility transistor as recited in claim 6, wherein said low and constant concentration has a mole fraction of aluminum in the order of 0.2.

8. A high electron mobility transistor as recited in claim 7, including an undoped spacer layer between said donor layer and said buffer layer.

9. A high electron mobility transistor including source, drain, and control electrodes, said transistor comprising:

a buffer layer of gallium arsenide;

a donor layer of aluminum gallium arsenide (AlGaAs) associated with said buffer layer of gallium arsenide for forming a two-dimensional electron gas (2DEG) therein;

said donor layer having a composition profile exhibiting a concentration of aluminum over a first thickness portion proximate said buffer layer, exhibiting a low and generally constant concentration of aluminum relative to said first thickness portion, over a second thickness portion distal from said buffer layer, wherein said low and generally constant concentration of aluminum is not greater than a mole fraction in the order of 0.2, and exhibiting a graded concentration of aluminum in a third thickness portion of said donor layer intermediate said first and second thickness portions for transitioning gradually between the differing concentrations of aluminum of said first and second thickness portions, wherein said first thickness portion is narrow compared with said second portion; and said donor layer having a doping profile exhibiting a doping spike associated with said first thickness portion and a low doping level over said second and third thickness portions as compared with said doping spike.

10. A high electron mobility transistor as recited in claim 9, wherein the concentration of aluminum in said doping spike associated with said first thickness portion is at least twice as great as the doping level over said second and third thickness portions.

* * * * *